United States Patent

Whikehart et al.

[11] Patent Number: 6,058,148
[45] Date of Patent: May 2, 2000

[54] DIGITAL PROCESSING RADIO RECEIVER WITH ADAPTIVE BANDWIDTH CONTROL

[75] Inventors: J. William Whikehart, Novi, Mich.; Christopher John Hagan, Colorado Springs, Colo.; John William Wagner, Ann Arbor, Mich.; Nicholas Lawrence Difiore, Farmington Hills, Mich.; John Elliott Whitecar, Plymouth, Mich.; James Alfred Wargnier, Harrison Township, Mich.

[73] Assignee: Ford Motor Company, Dearborn, Mich.

[21] Appl. No.: 08/883,692

[22] Filed: Jun. 27, 1997

[51] Int. Cl.[7] ....................................................... H04B 1/10
[52] U.S. Cl. .......................................... 375/350; 455/296
[58] Field of Search .................................... 375/350, 229, 375/230, 232, 329, 279, 346; 708/300, 322, 323; 455/296

[56] References Cited

U.S. PATENT DOCUMENTS

| | | |
|---|---|---|
| 4,115,668 | 9/1978 | Skrovanek et al. ...................... 379/412 |
| 4,124,817 | 11/1978 | Takahashi . |
| 4,352,208 | 9/1982 | Schroeder . |
| 4,356,567 | 10/1982 | Eguchi et al. . |
| 4,907,293 | 3/1990 | Ueno . |
| 5,155,862 | 10/1992 | Hansen . |
| 5,220,687 | 6/1993 | Ichikawa et al. . |
| 5,249,204 | 9/1993 | Funderburk et al. .................... 375/344 |
| 5,307,515 | 4/1994 | Kuo et al. . |
| 5,339,455 | 8/1994 | Vogt et al. . |
| 5,465,410 | 11/1995 | Hiben et al. . |
| 5,491,725 | 2/1996 | White . |
| 5,493,717 | 2/1996 | Schwarz . |
| 5,777,911 | 7/1998 | Sherry et al. ........................... 708/316 |

OTHER PUBLICATIONS

Simon Haykin, An Introduction to Analog and Digital Communications, 1989, pp. 281–283.

*Primary Examiner*—Don N. Vo
*Assistant Examiner*—Phuong Phu
*Attorney, Agent, or Firm*—Mark L. Mollon

[57] ABSTRACT

An adaptive intermediate frequency bandwidth control system detects IF signal levels both before and after channel filtering. The two levels are compared to provide a measure of the presence of interfering adjacent channels. This measure is compared to a programmable threshold and the IF bandwidth is narrowed if any interferers are detected. Digital FIR or IIR filtering is used. The invention allows bandwidth switching to be done very quickly with minimal transient effects. A difference threshold is selected depending upon the IF channel bandwidth being used at any given time.

4 Claims, 5 Drawing Sheets

DIGITAL PROCESSING RADIO RECEIVER WITH ADAPTIVE BANDWIDTH CONTROL

BACKGROUND OF THE INVENTION

The present invention relates in general to a digital signal processing radio receiver wherein an intermediate frequency signal is digitally processed, and more specifically, to filtering the intermediate frequency signal with a filter bandwidth which is adaptively controlled in response to the strength of adjacent or alternate channel interferers relative to the strength of the desired channel.

Commercial AM and FM broadcast bands include a plurality of evenly spaced channels. A particular broadcast station is allocated a unique channel to conduct broadcasting within an assigned frequency range.

The power spectrum of a broadcast transmission consists of the strength of RF signals irradiating a receiving antenna over a range of frequencies. Even though most energy in a transmission can be limited to its assigned channel, efficient use of all channels implies that some radiated energy will be at frequencies outside their assigned channels. Assignment of frequency channels to individual transmitters is determined according to geographic location and other factors to minimize interference between transmissions in adjacent channels and alternate channels (an alternate channel is a channel two channels away from the desired channel of interest). Since demand in populous areas is high for the limited number of channels available, adjacent and/or alternate channel interferers are often present. Therefore, radio receivers must be able to perform adequately in situations where a strong signal on an adjacent or alternate channel creates signal components in the desired channel which interfere with reception of the desired signal. In addition, channels even farther away than an alternate channel and even sources not associated with the broadcast band can become significant interferers.

Prior art radio receivers are known which detect the presence of adjacent channel or other interference in various ways and which attempt to reduce effects of the interference by narrowing the receiver bandwidth (or by shifting the receiver passband for the desired channel). Separate filters or retuning of the receiver are typical methods for detecting presence of an interfering channel. The prior art passband switching introduces transient effects which can be heard as noise. Furthermore, analog filtering that has been used does not provide sharp band edges (i.e., they have slow roll-off), so that not all of an interferer is removed.

With the advent of high speed digital signal processing (DSP) components, radio receivers are being introduced using DSP processors to implement demodulation and various other functions in a radio receiver. In particular, it is becoming possible to digitally process the intermediate frequency (IF) signal or even the radio frequency (RF) signal, thus avoiding a large number of analog circuits and components with their associated costs and space requirements. In order to keep costs down for a particular radio receiver, DSP performance in terms of 1) chip area required for processing, and 2) execution time need to be minimized.

SUMMARY OF THE INVENTION

The present invention has the advantage of adaptively filtering an intermediate frequency signal in response to the presence of adjacent channel interference while using digital signal processing in an efficient manner.

In one aspect of the invention, a radio reception circuit uses digital signal processing to digitally process an intermediate frequency (IF) signal. Circuit means provides a carrier-based signal (which in a preferred embodiment is an analog-to-digital converter generating a digitized IF signal). A complex mixer generates a complex I & Q signal in response to the carrier-based signal. A filter processor generates a filtered I & Q signal in response to the complex I & Q signal, the filter processor having an impulse response determined by filter coefficients loaded into the filter processor. The filter coefficients are switchable between a first bank of filter coefficients and a second bank of filter coefficients for a second bandwidth narrower than the first bandwidth. A post-filter level detector responds to the filtered I & Q signal to generate a first level signal. A pre-filter level detector responds to the digitized IF signal to generate a second level signal. A compare block coupled to the post-filter level detector, the pre-filter level detector, and the filter processor selects one of the banks of filter coefficients in response to a comparison of the first and second signal levels.

DETAILED DESCRIPTION OF PREFERRED EMBODIMENTS

Figure 1:
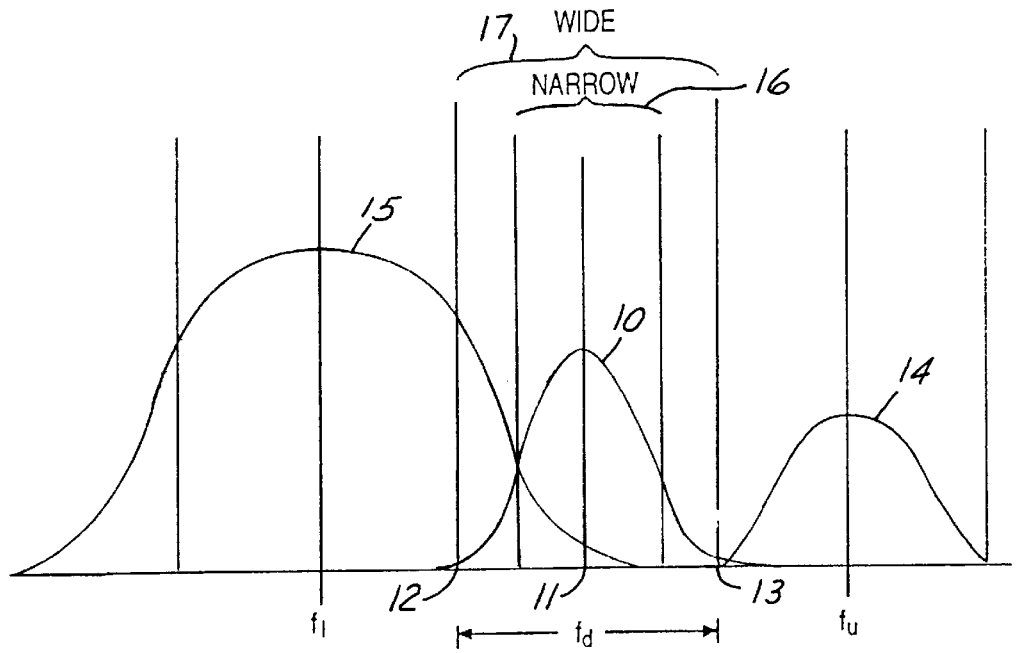
FIG. 1 plots reception field strength in a local reception area in which adjacent channel interference exists for a desired channel of interest.

FIG. 1 shows the frequency spectrum 10 of a desired radio broadcast having a center frequency 11 and occupying an assigned channel $f_d$ between a lower frequency 12 and an upper frequency 13. The upper adjacent channel $f_u$ is shown containing a broadcast signal 14 with substantially no excess signal content in the desired frequency channel, whereby the upper adjacent channel is not causing interference. However, the lower adjacent channel at $f_1$ is shown to include a radio broadcast having a frequency spectrum 15 including significant signal content above the lower frequency 12 of the desired channel. The resulting interference degrades reception of the desired radio broadcast.

Adjacent channel interference can be reduced by means of narrowing the passband of a bandwidth filter in the receiver to reduce the signal content from the adjacent channel propagating through the receiver. Thus, FIG. 1 shows a narrow bandwidth 16 which can be switched into the intermediate signal path to alleviate adjacent channel interference. When no adjacent channel interference is present, a wide bandwidth 17 is used in order to maximize quality of the received desired signal.

Figure 2:
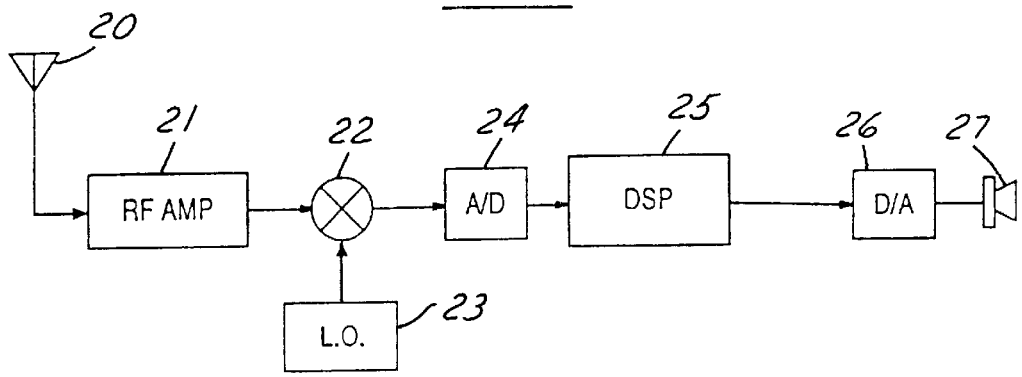
FIG. 2 is a block diagram showing portions of a DSP radio receiver.

FIG. 2 is a block diagram showing a radio receiver using digital signal processing. An antenna 20 receives broadcast RF signals which are coupled to an RF amplifier 21. Amplified RF signals are provided to one input of a mixer 22. A local oscillator 23 provides a mixing signal to a second input of mixer 22, the mixing signal having a frequency under control of a tuning control circuit (not shown). A carrier-based signal in the form of an intermediate frequency (IF) signal having a lower frequency than the original broadcast frequency is provided from mixer 22 to the input of an analog-to-digital (A/D) converter 24. A digitized IF signal is provided to digital signal processor (DSP) block 25 for filtering, demodulating, and other further processing of the resulting audio signal. A final audio signal is output from DSP 25 to the input of a digital-to-analog (D/A) converter 26 which provides analog audio signals to a speaker system 27.

DSP technology can be used to create a radio receiver having reduced cost and size, and having improved performance. In addition, new features and techniques can be easily added in DSP.

Figure 3:
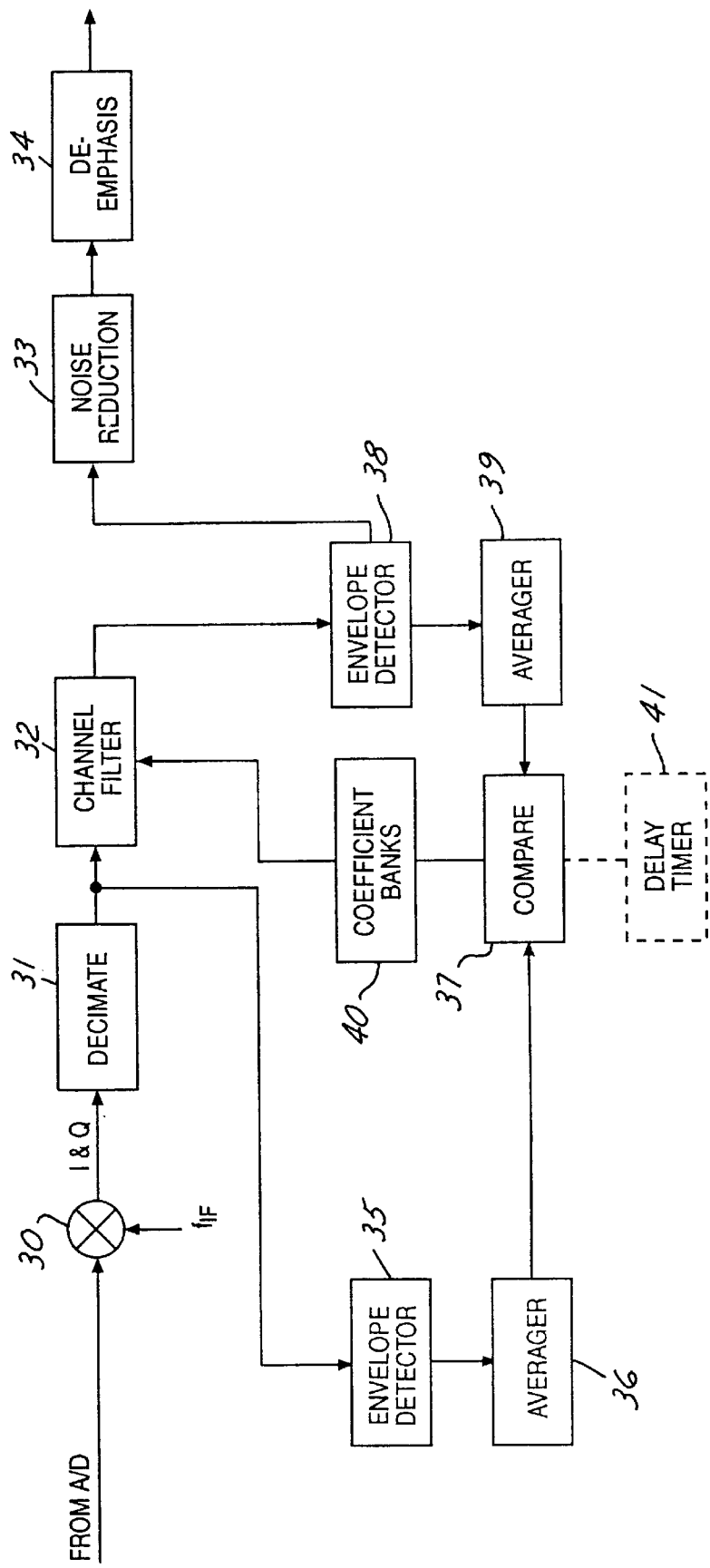
FIG. 3 is a block diagram showing DSP processing of an AM intermediate frequency signal in the manner of the present invention.

Processing of the digitized IF signal in DSP block 25 is shown in greater detail in FIG. 3. This embodiment is particularly adapted for receiving AM signals. The digitized IF signal is provided to one input of a mixer 30 which receives a mixing signal $f_{IF}$ at a second input. Mixer 30 is preferably a complex mixer and produces in-phase (I) and quadrature-phase (Q) signals. The frequency of injection signal $f_{IF}$ is nominally equal to the intermediate frequency from the A/D converter, such that the IF signal is mixed to a new IF frequency of approximately zero Hertz. Other non-zero IF frequencies or non-complex signal representations can also be used in DSP with the present invention. However, a zero-IF complex representation has many advantages in DSP processing such as compact code size, minimized chip area, and efficient data manipulation.

The complex I and Q signals are provided to a decimate block 31 which provides sample-reduced signals to the input of a channel filter 32. Channel filter 32 rejects signals outside the frequency band of interest and the bandwidth-limited signals are provided to an envelope detector 38. Envelope detection can be obtained as the square root of the sum of the squares of I and Q. An envelope detected signal is provided to a noise reduction block 33 and a de-emphasis block 34. Noise reduction block 33 operates dynamically according to frequency content of a signal and the relative amount of noise detected. De-emphasis block 34 provides compatibility with AMAX broadcasts.

Channel filter 32 is preferably implemented as a filter processor within DSP and has a switchable bandwidth according to switched filter coefficient banks from block 40.

The remaining components shown in FIG. 3 detect the presence of adjacent channel interferers and control the channel filter bandwidth accordingly. The decimated complex signal from decimate block 31 is provided to the input of an envelope detector 35. The envelope signal is provided to the input of an averager 36 which generates a level detection signal. One input of a compare block 37 receives the pre-channel filter level detection signal.

The output of envelope detector 38 is coupled to an averager 39 to provide a post-channel filter level detection signal to another input of compare block 37. Thus, a level detector upstream of channel filter 32 has its output compared to the output of a level detector downstream of channel filter 32. The difference in output level signals from the pre-filter level detector and the post-filter level detector is indicative of how much signal content from outside the desired channel is being filtered out by channel filter 32. The greater the signal content being filtered out, the greater the likelihood that there is an adjacent channel interferer. Thus, by comparing these two level signals in compare block 37, adjacent channel interference is detected and appropriate filter coefficient banks are selected from block 40 for loading in channel filter 32 to provide either narrowband or wideband filtering.

Compare block 37 utilizes a predetermined threshold for comparison with the difference between the level signals in order to determine whether sufficient adjacent channel energy is present to necessitate switching to the narrow bandwidth. Once a narrow bandwidth is selected, the difference in level signals can be expected to increase and a different threshold is then utilized in compare block 37. Furthermore, the thresholds employ hysteresis to avoid rapid switching back and forth of the bandwidth. Alternatively, a delay timer 41 is connected to compare block 37, so that the comparison is only performed periodically and so that bandwidth switching can only occur at predetermined intervals.

Figure 4:
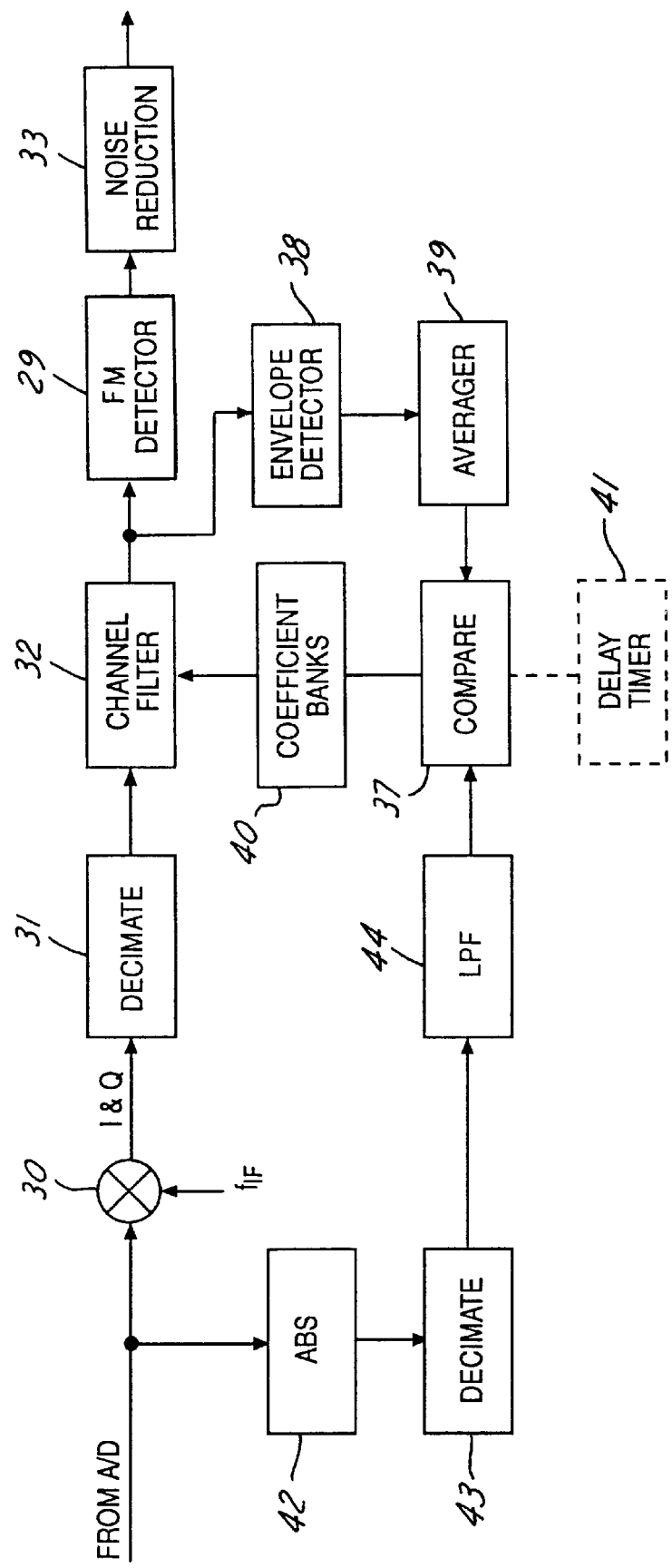
FIG. 4 is a block diagram showing DSP processing of an FM intermediate frequency signal in the manner of the present invention.

FIG. 4 shows an alternative embodiment for processing an FM-modulated IF frequency. The digitized IF (prior to complex mixing in mixer 30) is full-wave rectified in an absolute value block 42. An absolute value signal has its sample rate reduced in decimate block 43 which provides the same reduction in sample rate as decimate block 31. The sample-rate reduced absolute value signal is lowpass filtered in LPF 44 to produce the pre-filtered level detection signal. Post-filter level detection is similar to FIG. 3. An FM detector 29 is connected between channel filter 32 and noise reduction block 33.

Figure 5:
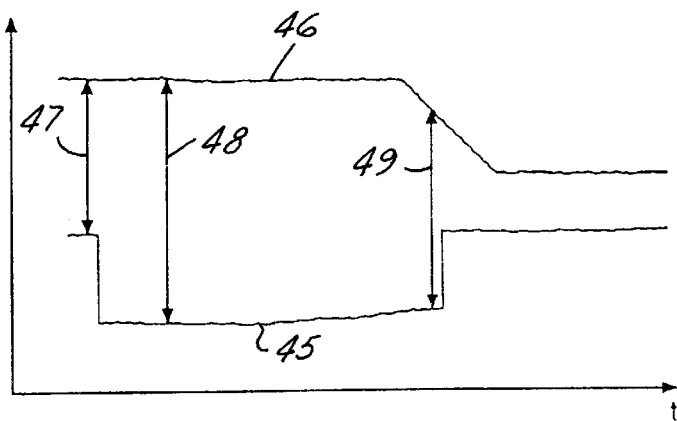
FIG. 5 plots detected level signals from pre-filter and post-filter level detectors during mobile reception.

FIG. 5 shows the magnitude of a first level signal 45 from the post-filter level detector and a second level signal 46 from the pre-filter level detector. It is the difference between these two signals that is compared with a threshold to determine which bank of filter coefficients is loaded into the filter processor in order to obtain either the narrow or wide bandwidth of the filter. Upon initially tuning to a desired channel, a difference 47 is found between the first and second level signals. This difference is determined with the filter processor being switched to its wide bandwidth (corresponding with receiving the full channel). Difference 47 is greater than a first difference threshold so that the bank of filter coefficients is switched to provide the narrower bandwidth for the channel filter. After switching, a difference 48 exists between the first and second level signals. In this example, the strength of the interfering adjacent channel signal gradually diminishes over time (e.g., as a mobile radio drives away from the corresponding transmitter). Eventually, a difference 49 is reached which is less than a second threshold used when the filter processor is at its narrower bandwidth, resulting in the switching back to the first bank of filter coefficients to provide a wider bandwidth.

Figure 6:
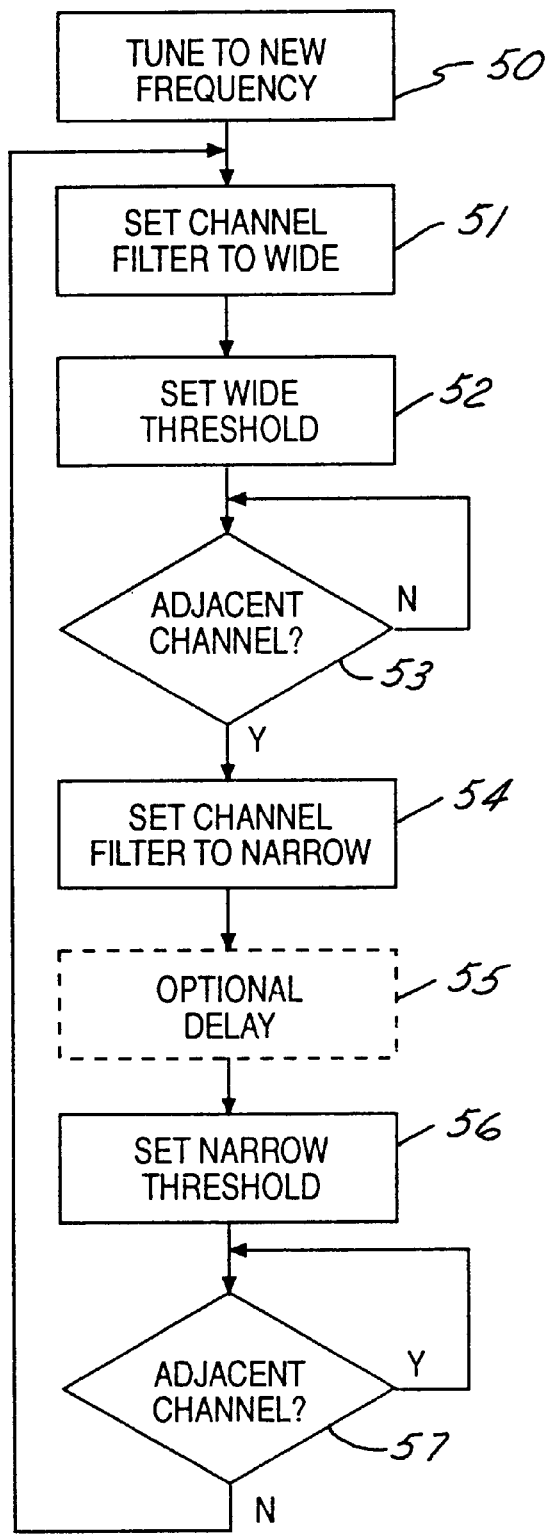
FIG. 6 is a flow-chart showing a preferred method of the present invention.

The method of the present invention is shown in greater detail in FIG. 6. In step 50, the radio receiver is tuned to a new frequency. In step 51, the filter coefficient bank is selected which sets the channel filter processor to a wide bandwidth. The difference threshold is set to a value corresponding to the use of the wide bandwidth filter in step 52. In step 53, a check is made for an adjacent channel interferer by comparing the difference between the first and second signal levels with the wide threshold. If the difference is not greater than the difference threshold, then no significant interferer is currently present. No action is taken but step 53 continues to monitor for changes in the comparison.

If the difference is greater than the difference threshold, then an interferer is present and the bank of filter coefficients is selected in step 54 which gives the channel filter its narrower bandwidth. To avoid erratic switching of the channel filter bandwidth, an optional delay of several seconds can be executed in step 55. Alternatively, erratic switching can be avoided by using hysteresis in the different thresholds selected (i.e., an guardband is added to further separate the two thresholds).

In step 56, the difference threshold is set to a value corresponding to use of the narrow bandwidth channel filter. In step 57, a check is made to detect adjacent channel interferers by comparing the difference with the narrowband threshold. If the difference is greater than the narrowband difference threshold, then an interferer is still present. No change is made and step 57 continues to check using the narrow filter bandwidth and narrow threshold. If the difference becomes less than the narrow threshold, then the adjacent channel interferer is no longer present and a return is made to step 51 for switching the channel filter back to its wide bandwidth.

Depending upon the typical likelihood of interferers being present, general reception conditions, and the desired performance of a receiver, FIG. 6 could be easily modified to start out using a narrow bandwidth and then switching to a wide bandwidth only if interferers are not present.

Figure 7:
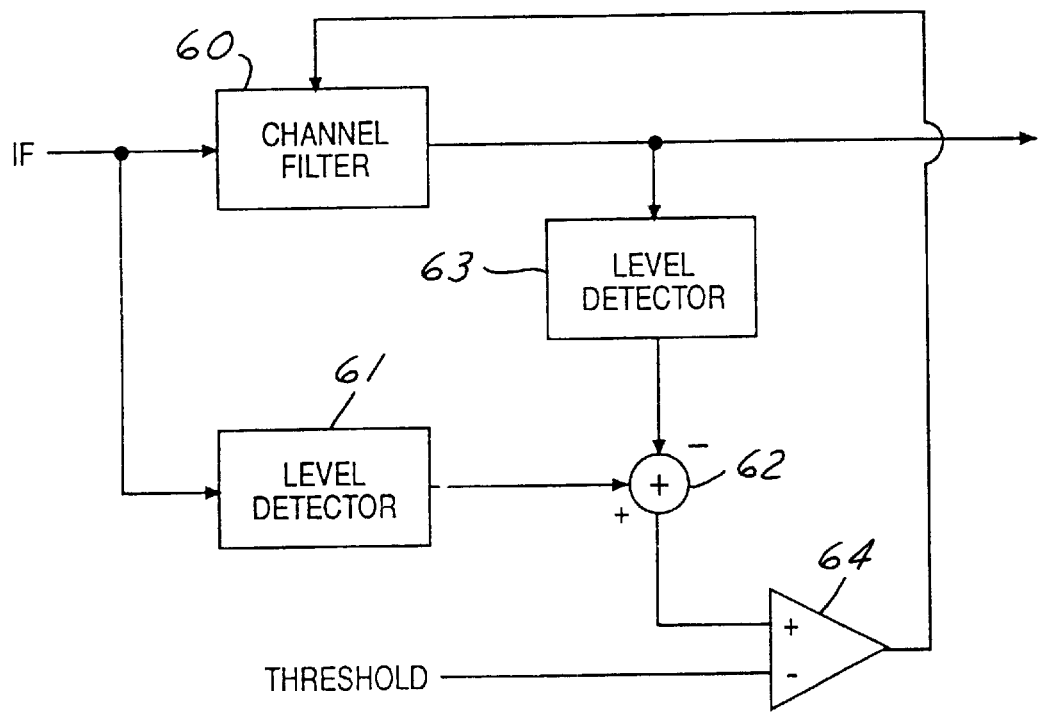
FIG. 7 is a block diagram showing an alternative representation of the present invention.

An alternative block diagram of the invention is shown in FIG. 7. Channel filter 60 uses a narrow or wide passband to filter the IF signal. A pre-filter level detector 61 generates a level signal in response to the pre-filtered IF signal and provides a level signal to one input of a summer 62. A post-filter level detector 63 generates a level signal responsive to the filtered IF signal and provides the level signal to another input of summer 62. One input of summer 62 is inverted so that the output of summer 62 provides a difference signal equal to the difference between the two level signals. The difference signal is applied to the non-inverting input of a comparator 64. A threshold signal is provided to the inverting input of comparator 64 and the comparator output is connected to an input of channel filter 60 for selecting the filter bandwidth. The magnitude of the threshold signal is set as described above.

Figure 8:
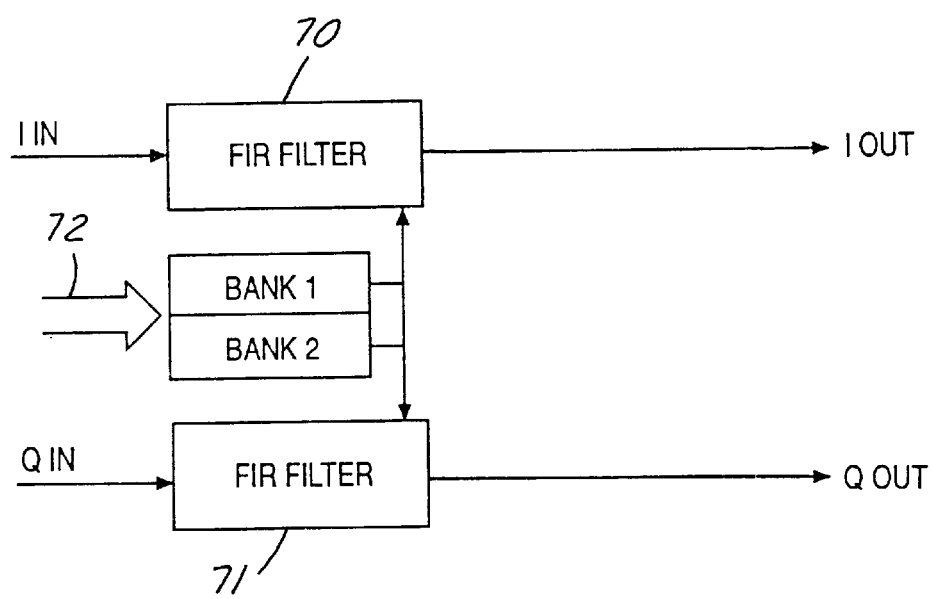
FIG. 8 is a block diagram showing a filter processor for implementing channel filter as used in the present invention.

FIG. 8 shows a channel filter in more detail. A finite impulse response (FIR) filter or an infinite impulse response (IIR) filter can be implemented using a DSP filter processor. In particular, applicants have used an FIR filter for FM processing and an IIR filter for AM processing. In the preferred embodiments, a complex (i.e. in-phase and quadrature-phase component) signal is used to represent the IF signal. Channel filtering for the I component and the Q component is provided by separate filter elements 70 and 71, respectively. For example, each FIR filter in FIG. 8 is comprised of a multi-tapped delay line and is configured according to filter coefficients stored in coefficient banks 1 and 2. Control signals 72 are provided to the filter coefficient banks in order to selectively load either bank 1 or bank 2 into FIR filters 70 and 71. FIR filtering has the advantage that the output of the filter has greater continuity before and after changing the filter bandwidth than does an IIR filter, and so transient effects are minimized. As another means to reduce transients, it may be desirable to set all signal values in the filter to zero at the time that the filter coefficients are switched. Alternatively, the receiver output can be briefly muted at the time of switching.

In other alternative embodiments, the present invention could utilize more than two discrete bandwidths. A range of bandwidths can be obtained using a plurality of filter coefficient banks and a like plurality of difference thresholds.

What is claimed is:

1. A radio reception circuit using digital signal processing (DSP) to digitally process an intermediate frequency (IF) signal, comprising:
   a circuit means providing a carrier-based signal;
   a complex mixer coupled to said circuit means and generating a complex I & Q signal in response to said carrier-based signal;
   a filter processor generating a filtered I & Q signal in response to said complex I & Q signal, said filter processor having an impulse response determined by filter coefficients loaded into said filter processor, said filter coefficients being switchable between a first bank of filter coefficients for a first bandwidth and a second bank of filter coefficients for a second bandwidth narrower than said first bandwidth;
   a post-filter level detector responsive to said filtered I & Q signal to generate a first level signal;
   a pre-filter level detector responsive to said carrier-based signal to generate a second level signal; and
   a compare block coupled to said post-filter level detector, said pre-filter level detector, and said filter processor for selecting one of said banks of filter coefficients in response to a comparison of said first and second signal levels, wherein said compare block determines a difference between said first level signal and said second level signal and compares said difference to a threshold, and wherein said threshold has a first value when said first bank of filter coefficients is selected and has a second value when said second bank of filter coefficients is selected, said first and second values of said threshold providing a predetermined hysteresis to prevent oscillation between said first and second banks of filter coefficients.

2. The radio reception circuit of claim 1 wherein said post-filter level detector is comprised of an envelope detector and an averager.

3. The radio reception circuit of claim 1 wherein said pre-filter level detector is comprised of an absolute value block and a lowpass filter.

4. A method for digitally processing an intermediate frequency (IF) signal, comprising the steps of:
   digitizing a carrier-based signal in response to a broadcast signal from an antenna;
   selecting a first bank of filter coefficients for a filter processor to provide a finite impulse response with a first bandwidth;
   filtering said carrier-based signal in said filter processor to generate a filtered IF signal;
   generating a first level signal in response to a signal level of said filtered IF signal;
   generating a second level signal in response to a signal level of said carrier-based signal prior to said filter processor;
   generating a difference signal in response to a difference between said first and second signal levels;
   selecting a first value for a threshold when said first bank of filter coefficients is being used;
   comparing said difference signal with said threshold;
   selecting a second bank of filter coefficients for said filter processor to provide an impulse response with a second bandwidth narrower than said first bandwidth if said difference is greater than said threshold;
   selecting a second value for said threshold which is relatively larger than said first value;

repeating said steps of filtering said carrier-based signal, generating first and second level signals, generating a difference signal, and comparing said difference signal with said threshold; and reselecting said first bank of filter coefficients if said difference is less than said second value of said threshold, said first and second values of said threshold providing a predetermined hysteresis to prevent oscillation between said first and second banks of filter coefficients.

* * * * *